US012555524B2

(12) United States Patent
Lee et al.

(10) Patent No.: US 12,555,524 B2
(45) Date of Patent: Feb. 17, 2026

(54) DISPLAY DEVICE AND METHOD OF PREDICTING DETERIORATION OF DISPLAY PANEL

(71) Applicant: Samsung Display Co., Ltd., Yongin-Si (KR)

(72) Inventors: Seung Jae Lee, Yongin-si (KR); Kuk Hwan Ahn, Yongin-si (KR); Dae Gwang Jang, Yongin-si (KR); Seong Heon Cho, Yongin-si (KR)

(73) Assignee: Samsung Display Co., Ltd., Yongin-si (KR)

( * ) Notice: Subject to any disclaimer, the term of this patent is extended or adjusted under 35 U.S.C. 154(b) by 0 days.

(21) Appl. No.: 18/896,892

(22) Filed: Sep. 26, 2024

(65) Prior Publication Data

US 2025/0292730 A1 Sep. 18, 2025

(30) Foreign Application Priority Data

Mar. 13, 2024 (KR) ........................ 10-2024-0035087

(51) Int. Cl.

| | |
|---|---|
| ***G09G 3/3208*** | (2016.01) |
| ***G09G 3/00*** | (2006.01) |
| ***G09G 3/32*** | (2016.01) |
| *G01R 13/40* | (2006.01) |

(52) U.S. Cl.

CPC ........... *G09G 3/3208* (2013.01); *G09G 3/006* (2013.01); *G09G 3/32* (2013.01); *G01R 13/401* (2013.01); *G09G 2320/041* (2013.01); *G09G 2330/045* (2013.01)

(58) Field of Classification Search

CPC ........ G09G 3/3208; G09G 3/006; G09G 3/32; G09G 2320/041; G09G 2330/045; G09G 2320/0295; G09G 2320/043; G01R 13/401

See application file for complete search history.

(56) References Cited

U.S. PATENT DOCUMENTS

| | | | | |
|---|---|---|---|---|
| 6,441,803 | B1 * | 8/2002 | Kasahara | G09G 3/2944 345/63 |
| 7,119,785 | B2 * | 10/2006 | Arimoto | G09G 3/3648 345/94 |
| 8,363,180 | B2 * | 1/2013 | Matsui | G09G 3/3648 349/56 |
| 9,159,272 | B2 * | 10/2015 | Murai | G09G 3/3413 |
| 9,576,530 | B2 * | 2/2017 | Kanda | G09G 3/3233 |
| 10,586,508 | B2 * | 3/2020 | Dunn | G09G 3/3406 |
| 10,891,897 | B2 * | 1/2021 | Xu | G09G 3/3233 |
| 11,837,161 | B2 * | 12/2023 | Hyeon | G09G 3/32 |

(Continued)

FOREIGN PATENT DOCUMENTS

| | | | |
|---|---|---|---|
| CN | 114495823 | A | 5/2022 |
| KR | 10-0615284 | B1 | 8/2006 |
| KR | 10-2385630 | B1 | 4/2022 |

*Primary Examiner* — Michael J Jansen, II

(74) *Attorney, Agent, or Firm* — Innovation Counsel LLP

(57) ABSTRACT

According to an embodiment of the disclosure, a display device includes a display unit including a plurality of areas, a driver integrated circuit including a plurality of integrated circuits driving the display unit, and a storage medium configured to store temperature information of the display unit. Each of the temperature information includes data for temperature increment values for each area of the display unit when the driver integrated circuit is driven.

18 Claims, 17 Drawing Sheets

(56) References Cited

U.S. PATENT DOCUMENTS

| | | | | |
|---|---|---|---|---|
| 12,073,778 | B2 * | 8/2024 | Ahn | G06F 3/0619 |
| 12,106,691 | B2 * | 10/2024 | Yamada | G09G 3/3233 |
| 12,340,733 | B2 * | 6/2025 | Cho | G09G 3/32 |
| 12,347,359 | B2 * | 7/2025 | Wu | G09F 9/302 |
| 12,380,840 | B2 * | 8/2025 | Ahn | G06F 3/0659 |
| 2002/0033815 | A1 * | 3/2002 | Kasahara | G09G 3/2944 345/204 |
| 2004/0075635 | A1 * | 4/2004 | Arimoto | G09G 3/3648 345/101 |
| 2012/0212520 | A1 * | 8/2012 | Matsui | G09G 3/3611 345/101 |
| 2012/0299979 | A1 * | 11/2012 | Murai | H05B 45/00 315/294 |
| 2015/0054722 | A1 * | 2/2015 | Kanda | G09G 3/3233 345/77 |
| 2018/0012565 | A1 * | 1/2018 | Dunn | G09G 3/3406 |
| 2020/0357336 | A1 * | 11/2020 | Xu | G09G 3/3233 |
| 2022/0189381 | A1 * | 6/2022 | Hunt | G09G 5/10 |
| 2022/0208065 | A1 * | 6/2022 | Kubo | G09G 3/2003 |
| 2023/0178022 | A1 * | 6/2023 | Seko | G09G 3/3233 345/207 |
| 2023/0186837 | A1 * | 6/2023 | Hyeon | G09G 3/32 345/694 |
| 2024/0021115 | A1 * | 1/2024 | Yamada | G01K 3/06 |
| 2024/0169895 | A1 * | 5/2024 | Ahn | G06F 3/0679 |
| 2024/0175942 | A1 * | 5/2024 | Agnello | G07C 5/0816 |
| 2024/0265852 | A1 * | 8/2024 | Cho | G09G 3/32 |
| 2024/0377967 | A1 * | 11/2024 | Ahn | G06F 3/0604 |
| 2025/0087128 | A1 * | 3/2025 | Wu | G09F 9/33 |

* cited by examiner

FIG. 9

S520

T_1_1

| | | | | | | | | | | | | | | | |
|---|---|---|---|---|---|---|---|---|---|---|---|---|---|---|---|
| 20.0°C | 20.0°C | 20.0°C | 20.0°C | 20.0°C | 20.0°C | 20.0°C | 20.0°C | 20.0°C | 20.0°C | 20.0°C | 20.0°C | 20.0°C | 20.0°C | 20.0°C | 20.0°C |
| 20.0°C | 20.0°C | 20.0°C | 20.0°C | 20.0°C | 20.0°C | 20.0°C | 24.0°C | 20.0°C | 20.0°C | 20.0°C | 20.0°C | 20.0°C | 20.0°C | 20.0°C | 20.0°C |
| 20.0°C | 20.0°C | 20.0°C | 20.0°C | 20.0°C | 20.0°C | 20.0°C | 28.3°C | 24.0°C | 20.0°C | 20.0°C | 20.0°C | 20.0°C | 20.0°C | 20.0°C | 20.0°C |
| 20.0°C | 20.0°C | 20.0°C | 20.0°C | 20.0°C | 27.0°C | 31.2°C | 34.0°C | 31.0°C | 26.2°C | 20.0°C | 20.0°C | 20.0°C | 20.0°C | 20.0°C | 20.0°C |
| 20.0°C | 20.0°C | 20.0°C | 20.0°C | 24.0°C | 29.0°C | 34.0°C | 43.0°C | 42.0°C | 38.2°C | 24.0°C | 20.0°C | 20.0°C | 20.0°C | 20.0°C | 20.0°C |
| 20.0°C | 20.0°C | 20.0°C | 20.0°C | 20.0°C | 27.1°C | 30.0°C | 40.0°C | 40.1°C | 33.1°C | 20.0°C | 20.0°C | 20.0°C | 20.0°C | 20.0°C | 20.0°C |
| 20.0°C | 20.0°C | 20.0°C | 20.0°C | 20.0°C | 20.0°C | 27.0°C | 32.8°C | 38.5°C | 30.0°C | 20.0°C | 20.0°C | 29.0°C | 20.0°C | 20.0°C | 20.0°C |
| 20.0°C | 20.0°C | 33.0°C | 28.0°C | 20.0°C | 20.0°C | 20.0°C | 24.0°C | 20.0°C | 20.0°C | 20.0°C | 20.0°C | 29.0°C | 20.0°C | 20.0°C | 20.0°C |
| 20.0°C | 20.0°C | 33.0°C | 31.0°C | 20.0°C | 20.0°C | 20.0°C | 20.0°C | 20.0°C | 20.0°C | 20.0°C | 20.0°C | 20.0°C | 20.0°C | 20.0°C | 20.0°C |
| 25.6°C | 36.0°C | 41.0°C | 30.2°C | 34.0°C | 34.3°C | 25.8°C | 35.5°C | 35.2°C | 25.3°C | 32.2°C | 33.3°C | 25.2°C | 33.4°C | 33.5°C | 25.1°C |

T_10_16

FIG. 10

S531

IV_1_1, IV_5_8, IV_10_16

| | | | | | | | | | | | | | | | |
|---|---|---|---|---|---|---|---|---|---|---|---|---|---|---|---|
| 0 | 0 | 0 | 0 | 0 | 0 | 0 | 0 | 0 | 0 | 0 | 0 | 0 | 0 | 0 | 0 |
| 0 | 0 | 0 | 0 | 0 | 0 | 0 | 4 | 0 | 0 | 0 | 0 | 0 | 0 | 0 | 0 |
| 0 | 0 | 0 | 0 | 0 | 0 | 6.5 | 8.3 | 4 | 0 | 0 | 0 | 0 | 0 | 0 | 0 |
| 0 | 0 | 0 | 0 | 0 | 7 | 11.2 | 14 | 11 | 6.2 | 0 | 0 | 0 | 0 | 0 | 0 |
| 0 | 0 | 0 | 0 | 4 | 9 | 14 | 23 | 22 | 18.2 | 4 | 0 | 0 | 0 | 0 | 0 |
| 0 | 0 | 0 | 0 | 0 | 7.1 | 10 | 20 | 20.1 | 13.1 | 0 | 0 | 0 | 0 | 0 | 0 |
| 0 | 0 | 0 | 0 | 0 | 0 | 7 | 12.8 | 18.5 | 10 | 0 | 0 | 9 | 0 | 0 | 0 |
| 0 | 0 | 13 | 8 | 0 | 0 | 0 | 4 | 0 | 0 | 0 | 0 | 9 | 0 | 0 | 0 |
| 0 | 0 | 13 | 11 | 0 | 0 | 0 | 0 | 0 | 0 | 0 | 0 | 0 | 0 | 0 | 0 |
| 5.6 | 16 | 21 | 10.2 | 14 | 14.3 | 5.8 | 15.5 | 15.2 | 5.3 | 12.2 | 13.3 | 5.2 | 13.4 | 13.5 | 5.1 |

S531 } S530

FIG. 11

S532

RP_1_1 RP_5_8

| | | | | | | | | | | | | | | | |
|---|---|---|---|---|---|---|---|---|---|---|---|---|---|---|---|
| 0% | 0% | 0% | 0% | 0% | 0% | 0% | 0% | 0% | 0% | 0% | 0% | 0% | 0% | 0% | 0% |
| 0% | 0% | 0% | 0% | 0% | 0% | 0% | 17% | 0% | 0% | 0% | 0% | 0% | 0% | 0% | 0% |
| 0% | 0% | 0% | 0% | 0% | 0% | 28% | 36% | 17% | 0% | 0% | 0% | 0% | 0% | 0% | 0% |
| 0% | 0% | 0% | 0% | 0% | 30% | 49% | 61% | 48% | 27% | 0% | 0% | 0% | 0% | 0% | 0% |
| 0% | 0% | 0% | 0% | 17% | 39% | 61% | 100% | 96% | 79% | 17% | 0% | 0% | 0% | 0% | 0% |
| 0% | 0% | 0% | 0% | 0% | 31% | 43% | 87% | 87% | 57% | 0% | 0% | 0% | 0% | 0% | 0% |
| 0% | 0% | 0% | 0% | 0% | 0% | 30% | 56% | 80% | 43% | 0% | 0% | 39% | 0% | 0% | 0% |
| 0% | 0% | 57% | 35% | 0% | 0% | 0% | 17% | 0% | 0% | 0% | 0% | 39% | 0% | 0% | 0% |
| 0% | 0% | 57% | 48% | 0% | 0% | 0% | 0% | 0% | 0% | 0% | 0% | 0% | 0% | 0% | 0% |
| 24% | 70% | 91% | 44% | 61% | 62% | 25% | 67% | 66% | 23% | 53% | 58% | 23% | 58% | 59% | 22% |

S532 } S530

RP_10_16

FIG. 12

TI1

| | | | | | | | | | | | | | | | |
|---|---|---|---|---|---|---|---|---|---|---|---|---|---|---|---|
| 0% | 0% | 0% | 0% | 0% | 0% | 0% | 0% | 0% | 0% | 0% | 0% | 0% | 0% | 0% | 0% |
| 0% | 0% | 0% | 0% | 0% | 0% | 0% | 25% | 0% | 0% | 0% | 0% | 0% | 0% | 0% | 0% |
| 0% | 0% | 0% | 0% | 0% | 0% | 41% | 52% | 25% | 0% | 0% | 0% | 0% | 0% | 0% | 0% |
| 0% | 0% | 0% | 0% | 0% | 44% | 70% | 88% | 69% | 39% | 0% | 0% | 0% | 0% | 0% | 0% |
| 0% | 0% | 0% | 0% | 25% | 56% | 88% | 100% | 88% | 51% | 25% | 0% | 0% | 0% | 0% | 0% |
| 0% | 0% | 0% | 0% | 0% | 44% | 63% | 88% | 76% | 32% | 0% | 0% | 0% | 0% | 0% | 0% |
| 0% | 0% | 0% | 0% | 0% | 0% | 44% | 55% | 41% | 0% | 0% | 0% | 39% | 0% | 0% | 0% |
| 0% | 0% | 0% | 0% | 0% | 0% | 0% | 25% | 0% | 0% | 0% | 0% | 39% | 0% | 0% | 0% |
| 0% | 0% | 0% | 0% | 0% | 0% | 0% | 0% | 0% | 0% | 0% | 0% | 0% | 0% | 0% | 0% |
| 0% | 0% | 0% | 0% | 0% | 0% | 0% | 0% | 0% | 0% | 0% | 0% | 0% | 0% | 0% | 0% |

IV_5_8

TI1
TI2 } TI
TI3

FIG. 14

TI3

| | | | | | | | | | | | | | | | |
|---|---|---|---|---|---|---|---|---|---|---|---|---|---|---|---|
| 0% | 0% | 0% | 0% | 0% | 0% | 0% | 0% | 0% | 0% | 0% | 0% | 0% | 0% | 0% | 0% |
| 0% | 0% | 0% | 0% | 0% | 0% | 0% | 0% | 0% | 0% | 0% | 0% | 0% | 0% | 0% | 0% |
| 0% | 0% | 0% | 0% | 0% | 0% | 0% | 0% | 0% | 0% | 0% | 0% | 0% | 0% | 0% | 0% |
| 0% | 0% | 0% | 0% | 0% | 0% | 0% | 0% | 0% | 0% | 0% | 0% | 0% | 0% | 0% | 0% |
| 0% | 0% | 0% | 0% | 0% | 0% | 0% | 0% | 0% | 0% | 0% | 0% | 0% | 0% | 0% | 0% |
| 0% | 0% | 0% | 0% | 0% | 0% | 0% | 0% | 0% | 0% | 0% | 0% | 0% | 0% | 0% | 0% |
| 0% | 0% | 0% | 0% | 0% | 0% | 0% | 0% | 0% | 0% | 0% | 0% | 0% | 0% | 0% | 0% |
| 0% | 0% | 0% | 0% | 0% | 0% | 0% | 0% | 0% | 0% | 0% | 0% | 0% | 0% | 0% | 0% |
| 0% | 0% | 0% | 0% | 0% | 0% | 0% | 0% | 0% | 0% | 0% | 0% | 0% | 0% | 0% | 0% |
| 35% | 100% | 94% | 33% | 88% | 89% | 36% | 97% | 95% | 33% | 76% | 83% | 33% | 84% | 84% | 32% |

IV_10_2

TI1
TI2 } TI
TI3

FIG. 16

1310

| | | | | | | | | | | | | | | | |
|---|---|---|---|---|---|---|---|---|---|---|---|---|---|---|---|
| 0°C | 0°C | 0°C | 0°C | 0°C | 0°C | 0°C | 0°C | 0°C | 0°C | 0°C | 0°C | 0°C | 0°C | 0°C | 0°C |
| 0°C | 0°C | 0°C | 0°C | 0°C | 0°C | 0°C | 4°C | 0°C | 0°C | 0°C | 0°C | 0°C | 0°C | 0°C | 0°C |
| 0°C | 0°C | 0°C | 0°C | 0°C | 0°C | 6.5°C | 8.3°C | 4°C | 0°C | 0°C | 0°C | 0°C | 0°C | 0°C | 0°C |
| 0°C | 0°C | 0°C | 0°C | 0°C | 7°C | 11.2°C | 14°C | 11°C | 6.2°C | 0°C | 0°C | 0°C | 0°C | 0°C | 0°C |
| 0°C | 0°C | 0°C | 0°C | 4°C | 9°C | 14°C | 23°C | 22°C | 18.2°C | 4°C | 0°C | 0°C | 0°C | 0°C | 0°C |
| 0°C | 0°C | 0°C | 0°C | 0°C | 7.1°C | 10°C | 20°C | 20.1°C | 13.1°C | 0°C | 0°C | 0°C | 0°C | 0°C | 0°C |
| 0°C | 0°C | 0°C | 0°C | 0°C | 0°C | 7°C | 12.8°C | 18.5°C | 10°C | 0°C | 0°C | 9°C | 0°C | 0°C | 0°C |
| 0°C | 0°C | 13°C | 8°C | 0°C | 0°C | 0°C | 4°C | 0°C | 0°C | 0°C | 0°C | 9°C | 0°C | 0°C | 0°C |
| 0°C | 0°C | 13°C | 11°C | 0°C | 0°C | 0°C | 0°C | 0°C | 0°C | 0°C | 0°C | 0°C | 0°C | 0°C | 0°C |
| 0°C | 0°C | 23.9°C | 4.7°C | 0°C | 0°C | 0°C | 0°C | 0°C | 0°C | 0°C | 0°C | 0°C | 0°C | 0°C | 0°C |

DISPLAY DEVICE AND METHOD OF PREDICTING DETERIORATION OF DISPLAY PANEL

This application claims priority to Korean Patent Application No. 10-2024-0035087, filed on Mar. 13, 2024, and all the benefits accruing therefrom under 35 U.S.C. § 119, the content of which in its entirety is herein incorporated by reference.

BACKGROUND

1. Field

The disclosure relates to a display device and a method of predicting deterioration of a display panel.

2. Description of the Related Art

Recently, a display device that display an image using digital data, for example, a liquid crystal display (LCD) using a liquid crystal, an organic light emitting diode (OLED) display using an OLED, an electrophoretic display (EPD) using an electrophoretic particle, and the like is widely used.

Among them, the OLED display is a self-emission device that emits light in an organic light emitting layer by recombination of an electron and a hole. The OLED display has high luminance\, a low driving voltage, ultra-thin thickness, and thus the OLED display is expected to be a next-generation display device.

The OLED display may include a display unit including pixels, a driver integrated circuit for driving the display unit, and the like. Heat generated in a process of driving the driver integrated circuit may be transferred to the display unit. In addition, a deterioration speed of the pixels may be accelerated due to the heat.

The content described above is only intended to help understanding of the background technology of the technical ideas of the disclosure, and therefore, it cannot be understood as a content corresponding to prior art known to those skilled in the art of the disclosure.

SUMMARY

Embodiments of the disclosure are to provide a display device and a method of predicting deterioration of a display panel which may sense (or predict) a deterioration speed of pixels due to heat generated in a driving process of the display panel.

According to an embodiment of the disclosure, a display device includes a display unit including a plurality of areas, a driver integrated circuit including a plurality of integrated circuits driving the display unit, and a storage medium configured to store temperature information of the display unit. Each of the temperature information includes data for temperature increment values for each area of the display unit when the driver integrated circuit is driven.

The data for the temperature increment values for each area may be percentage values.

Each of the percentage value may be a value obtained by dividing a temperature increment value of one of the plurality of areas by a maximum temperature increment value of the plurality of areas.

Each of the temperature information includes the maximum temperature increment value.

The storage medium may further store other information which may include heat generation information of the display unit according to a driving frequency of the driver integrated circuit and heat generation information of the display unit according to an amount of a data signal transmitted to the display unit from the driver integrated circuit.

The driver integrated circuit may retrieve the temperature information and the other information from the storage medium, generate a temperature map using the temperature information and the other information, and predict a deterioration degree for each area of the display unit based on the temperature map.

Each of the plurality of areas may have the same area.

Each of the temperature increment values may be a value obtained by subtracting a temperature measurement value before driving the driver integrated circuit from a temperature measurement value after driving the driver integrated circuit.

The temperature measurement value may be a value measured using a thermal imaging camera.

The plurality of integrated circuits may include a first integrated circuit and a second integrated circuit, the temperature information may include first temperature information and second temperature information, the first temperature information may be generated in a state in which the second integrated circuit is not driven and the first integrated circuit is driven, and the second temperature information may be generated in a state in which the first integrated circuit is not driven and the second integrated circuit is driven.

A method of predicting deterioration of a display panel including a display unit which may include a plurality of areas and a driver integrated circuit which may include a plurality of integrated circuits driving the display unit. The method may include driving the driver integrated circuit, measuring a front temperature of the display unit, generating temperature information based on the measured front temperature of the display unit, and storing the generated temperature information in a storage medium before shipment of a product. The generating the temperature information before shipment of the product may include calculating temperature increment values for each area of the display unit when the driver integrated circuit is driven and converting the temperature increment values for each area into a percentage value.

The method may further include storing other information in the storage medium before shipment of the product. The other information may include heat generation information of the display unit according to a driving frequency of the driver integrated circuit and heat generation information of the display unit according to an amount of a data signal transmitted to the display unit from the driver integrated circuit.

Each of the plurality of areas may have the same area.

Each of the temperature increment values may be a value obtained by dividing a temperature increment value of one of the plurality of areas by a maximum temperature increment value of the plurality of areas.

The temperature measurement value may be a value measured using a thermal imaging camera.

The percentage value may be a value obtained by calculating a maximum temperature increment value among the temperature increment values for each area and converting based on the maximum temperature increment value.

The temperature information may include the maximum temperature increment value.

The plurality of integrated circuits may include a first integrated circuit and a second integrated circuit, the temperature information may include first temperature information and second temperature information, the first temperature information may be generated in a state in which the second integrated circuit is not driven and the first integrated circuit is driven, and the second temperature information may be generated in a state in which the first integrated circuit is not driven and the second integrated circuit is driven.

A method of predicting deterioration of a display panel including a display unit which includes a plurality of areas and a driver integrated circuit which includes a plurality of integrated circuits driving the display unit may include driving the driver integrated circuit, measuring a front temperature of the display unit, generating temperature information based on the measured front temperature of the display unit, and storing the generated temperature information in a storage medium before shipment of a product, and generating a temperature map based on the temperature information after shipment of the product. The generating the temperature information before shipment of the product may include calculating temperature increment values for each area of the display unit when the driver integrated circuit is driven and converting the temperature increment values for each area into a percentage value.

The method may further include storing other information in the storage medium before shipment of the product and compensating the temperature map based on the other information and predicting deterioration of the display panel through the compensated temperature map after shipment of the product. The other information may include heat generation information of the display unit according to a driving frequency of the driver integrated circuit and heat generation information of the display unit according to an amount of a data signal transmitted to the display unit from the driver integrated circuit.

A display device and a method of predicting deterioration of a display panel according to embodiments of the disclosure, a deterioration speed of pixels due to heat generated in a driving process of the display panel may be sensed (or predicted).

An effect according to embodiments is not limited to the contents exemplified above, and further various effects are included in the present specification.

BRIEF DESCRIPTION OF THE DRAWINGS

The above and other features of the disclosure will become more apparent by describing in further detail embodiments thereof with reference to the accompanying drawings, in which:

FIGS. 7, 8 and 9 are diagrams illustrating step S520 of FIG. 5;

FIG. 10 is a diagram illustrating step S531 of FIG. 6;

FIG. 11 is a diagram illustrating step S532 of FIG. 6;

FIGS. 12, 13 and 14 are diagrams illustrating temperature information when driving a portion of integrated circuits of a driver integrated circuit;

FIG. 16 is a diagram illustrating S1310 of FIG. 15;

DETAILED DESCRIPTION OF THE EMBODIMENT

Figure 1:
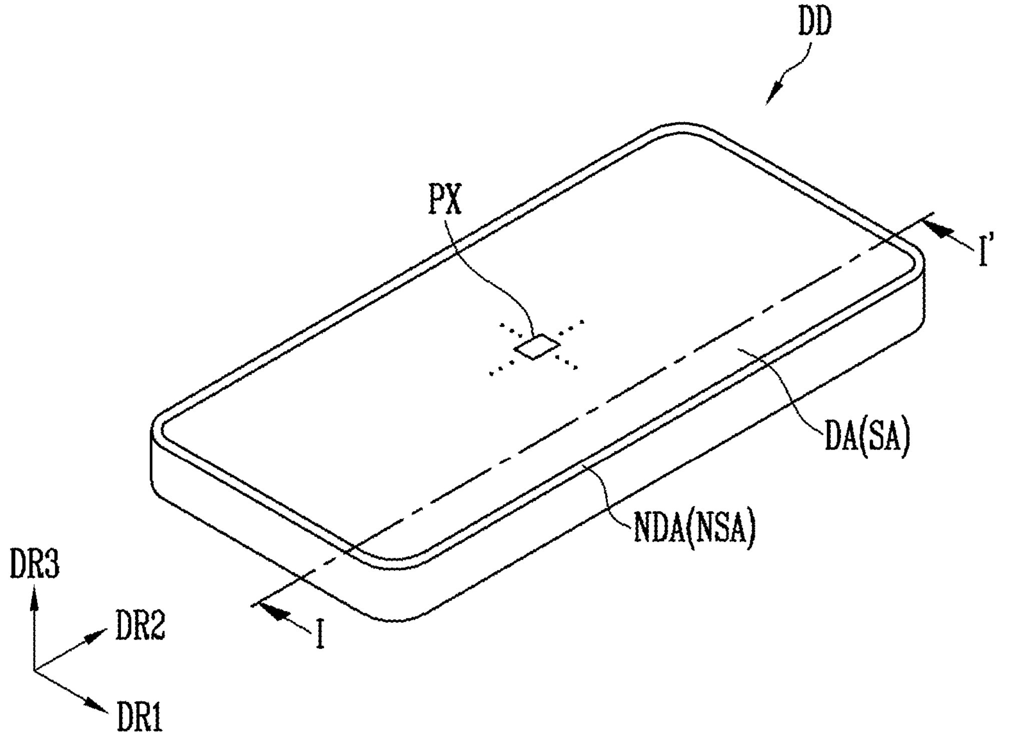
FIG. 1 is a diagram illustrating a display device according to embodiments of the disclosure.

Hereinafter, an embodiment according to the disclosure is described in detail with reference to the accompanying drawings. It should be noted that in the following description, only portions necessary for understanding an operation according to the disclosure are described, and descriptions of other portions are omitted in order not to obscure the subject matter of the disclosure. In addition, the disclosure may be embodied in other forms without being limited to the embodiment described herein. However, the embodiment described herein is provided to describe in detail enough to easily implement the technical spirit of the disclosure to those skilled in the art to which the disclosure belongs.

Throughout the specification, in a case where a portion is "connected" to another portion, the case includes not only a case where the portion is "directly connected" but also a case where the portion is "indirectly connected" with another element interposed therebetween. Terms used herein are for describing specific embodiments and are not intended to limit the disclosure. Throughout the specification, in a case where a certain portion "includes", the case means that the portion may further include another component without excluding another component unless otherwise stated. "At least any one of X, Y, and Z" and "at least any one selected from a group consisting of X, Y, and Z" may be interpreted as one X, one Y, one Z, or any combination of two or more of X, Y, and Z (for example, XYZ, XYY, YZ, and ZZ). Here, "and/or" includes all combinations of one or more of corresponding configurations.

Here, terms such as first and second may be used to describe various components, but these components are not limited to these terms. These terms are used to distinguish one component from another component. Therefore, a first component may refer to a second component within a range without departing from the scope disclosed herein.

Spatially relative terms such as "under", "on", and the like may be used for descriptive purposes, thereby describing a relationship between one element or feature and another element(s) or feature(s) as shown in the drawings. Spatially relative terms are intended to include other directions in use, in operation, and/or in manufacturing, in addition to the direction depicted in the drawings. For example, when a device shown in the drawing is turned upside down, elements depicted as being positioned "under" other elements or features are positioned in a direction "on" the other elements or features. Therefore, in an embodiment, the term "under" may include both directions of on and under. In addition, the device may face in other directions (for example, rotated 90 degrees or in other directions) and thus the spatially relative terms used herein are interpreted according thereto.

Various embodiments are described with reference to drawings schematically illustrating ideal embodiments. Accordingly, it will be expected that shapes may vary, for example, according to tolerances and/or manufacturing techniques. Therefore, the embodiments disclosed herein cannot be construed as being limited to specific shapes shown, and should be interpreted as including, for example, changes in shapes that occur as a result of manufacturing. As described above, the shapes shown in the drawings may not show actual shapes of areas of a device, and the present embodiments are not limited thereto.

FIG. 1 is a diagram illustrating a display device according to embodiments of the disclosure.

Referring to FIG. 1, the display device DD refers to a device that may provide visual data to a user. The display device defined in this specification refers to a device including a light emitting element that may emit light when an electrical signal is applied. That is, the display device DD according to an embodiment of the disclosure is not limited to a specific device such as a tablet PC, a television, a smart phone, and a notebook computer. The display device DD may be a stereoscopic shape extending in a first direction DR1, a second direction DR2 crossing the first direction DR1, and a third direction DR3 crossing the first direction DR1 and the second direction DR2.

The display device DD may include a display area DA, a non-display area NDA, a sensing area SA, and a non-sensing area NSA.

The display device DD may display an image through the display area DA and may also sense a touch input from the user or sense light incident from the front through the sensing area SA. A touch sensor of the display device DD may be positioned in the sensing area SA.

The touch sensor of the display device DD may not be positioned in the non-sensing area NSA. The non-detection area NSA may surround the detection area SA, but this is an example and is not limited thereto.

According to an embodiment, a partial area of the display area DA may correspond to the sensing area SA. A partial area of the non-display area NDA may correspond to the non-sensing area NSA.

The display device DD may output visual information through a front surface of the display device DD. The display device DD may include at least one pixel PX. The pixels PX may be positioned in the display area DA.

Each pixel PX may include a light emitting element. In this specification, the light emitting element may include a light source that emits light when an electrical signal is applied. Each of the pixels PX may emit light through the display area DA when an electrical signal corresponding to image data is applied to each of the pixels PX.

The light emitting element may be an inorganic light emitting element including an inorganic light emitting material or a light emitting element that emits light by changing a wavelength of emitted light using a quantum dot (or a quantum dot display device). According to an embodiment, the light emitting element may be an organic light emitting element including an organic light emitting material.

Figure 2:
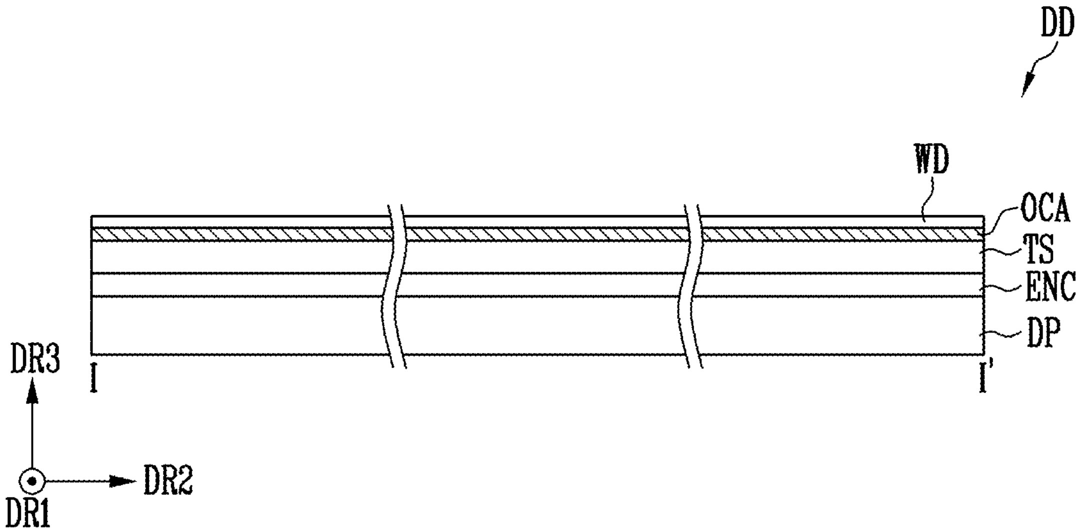
FIG. 2 is a cross-sectional view taken along line I~I' of FIG. 1.

FIG. 2 is a cross-sectional view taken along line I~I' of FIG. 1.

Referring to FIG. 2, the display device DD may include a display panel DP, an encapsulation layer ENC, a touch sensor TS, an optically transparent adhesive member OCA, and a window WD.

The display panel DP may output visual data. The display panel DP is described later with reference to FIG. 3.

The encapsulation layer ENC may be positioned on the display panel DP. The encapsulation layer ENC may prevent external moisture and oxygen from permeating into the display panel DP.

The touch sensor TS may be positioned on the encapsulation layer ENC. The touch sensor TS may be positioned in the sensing area (refer to 'SA' of FIG. 1). According to an embodiment, the display panel DP and the touch sensor TS may be integrally manufactured.

The touch sensor TS may obtain information on the touch input when the touch input is applied from the user. The touch sensor TS may recognize the touch input using a capacitive sensing method. The touch sensor TS may sense the touch input in a mutual capacitance method or a self-capacitance method.

The window WD may be positioned on the touch sensor TS. The window WD may be a transparent and light-transmissive substrate. The window WD and the touch sensor TS may be coupled to each other through the optically transparent adhesive member OCA. The window WD may transmit visual information and protect the display device DD from an external shock applied to the display device DD. For example, the window WD may be implemented using hard glass, flexible plastic, or the like. However, embodiments of the disclosure are not limited thereto.

Figure 3:
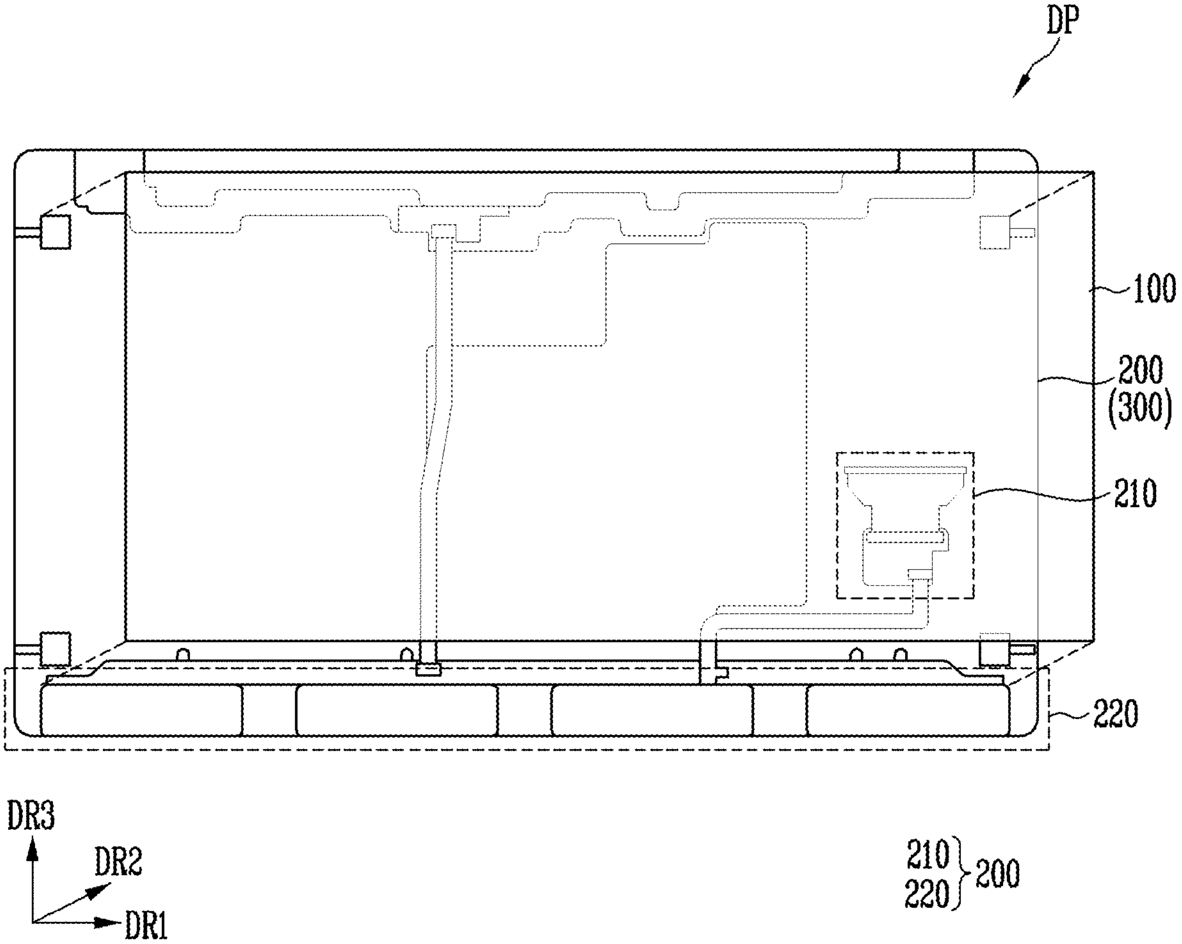
FIG. 3 is an exploded perspective view schematically illustrating a display panel of FIG. 2.

FIG. 3 is an exploded perspective view schematically illustrating the display panel of FIG. 2.

Referring to FIG. 3, the display panel DP may include a display unit 100, a driver integrated circuit 200, and a storage medium 300. However, the disclosure is not limited thereto, and the driver integrated circuit 200 and the storage medium 300 may be implemented as separate components from the display panel DP.

The display unit 100 may correspond to the display area DA of the display panel DP. The display unit 100 may include at least one pixel PX. The display unit 100 may output visual information through the front surface of the display device DD.

The driver integrated circuit 200 may overlap the display unit 100 in at least a partial area. The driver integrated circuit 200 may include a plurality of integrated circuits including first and second integrated circuits 210 and 220, and the driver integrated circuit 200 may drive the display unit 100 using the plurality of integrated circuits. For example, the driver integrated circuit 200 may adjust a luminance of the pixels PX of the display unit 100 using the plurality of integrated circuits.

A portion of the plurality of integrated circuits may be disposed in the display area DA of the display panel DP and may overlap the display unit 100. For example, the first integrated circuit 210 among the plurality of integrated circuits may be disposed in the display area DA of the display panel DP and may overlap the display unit 100. A portion of the plurality of integrated circuits may be disposed in the non-display area NDA of the display panel DP and may not overlap the display unit 100. For example, the second integrated circuit 220 among the plurality of integrated circuits may be disposed in the non-display area NDA of the display panel DP not to overlap the display unit 100.

In a process in which the plurality of integrated circuits drive the display unit 100, the plurality of integrated circuits may emit heat, and the emitted heat may be transferred to the display unit 100. The pixels PX of the display unit 100 may be heated due to the heat transferred from the plurality of integrated circuits to the display unit 100. In addition, a deterioration speed of the pixels PX of the heated display unit 100 may be accelerated. For example, when a temperature of the display unit 100 increases from 30° C. to 50° C., the deterioration speed of the pixels PX of the display unit 100 may increase twice.

The integrated circuits disposed in the display area DA of the display panel DP may overlap the display unit 100, and the integrated circuits disposed in the non-display area NDA of the display panel DP may not overlap the display unit 100. An amount of heat transferred to the display unit 100 by the integrated circuits disposed to overlap the display area DA may be greater than an amount of heat transferred to the display unit 100 by the integrated circuits disposed not to overlap the display area DA, for example, disposed in the non-display area NDA. The integrated circuits disposed to overlap the display area DA of the display panel DP may give a greater influence on the deterioration speed of the pixels PX compared to the integrated circuits disposed not to overlap the display area DA, for example, disposed in the non-display area NDA of the display panel DP. In addition, according to a disposition of the integrated circuits, an amount of heat transferred from the driver integrated circuit 200 to the display unit 100 may be different for each area of the display unit 100, and a temperature distribution may be different for each area of the display unit 100.

As shown in FIG. 3, the storage medium 300 and the driver integrated circuit 200 may be mounted on one substrate together. The storage medium 300 may store temperature information TI (refer to FIG. 4) and other information OI (refer to FIG. 4) of the display unit 100. According to an embodiment of the disclosure, the driver integrated circuit 200 may retrieve the temperature information TI and the other information OI from the storage medium 300. In addition, the driver integrated circuit 300 may generate a temperature map using the retrieved temperature information TI and other information OI when a user using the display panel. The driver integrated circuit 300 may predict the deterioration speed of the pixels PX of the display unit 100 based on the generated temperature map.

Figure 4:
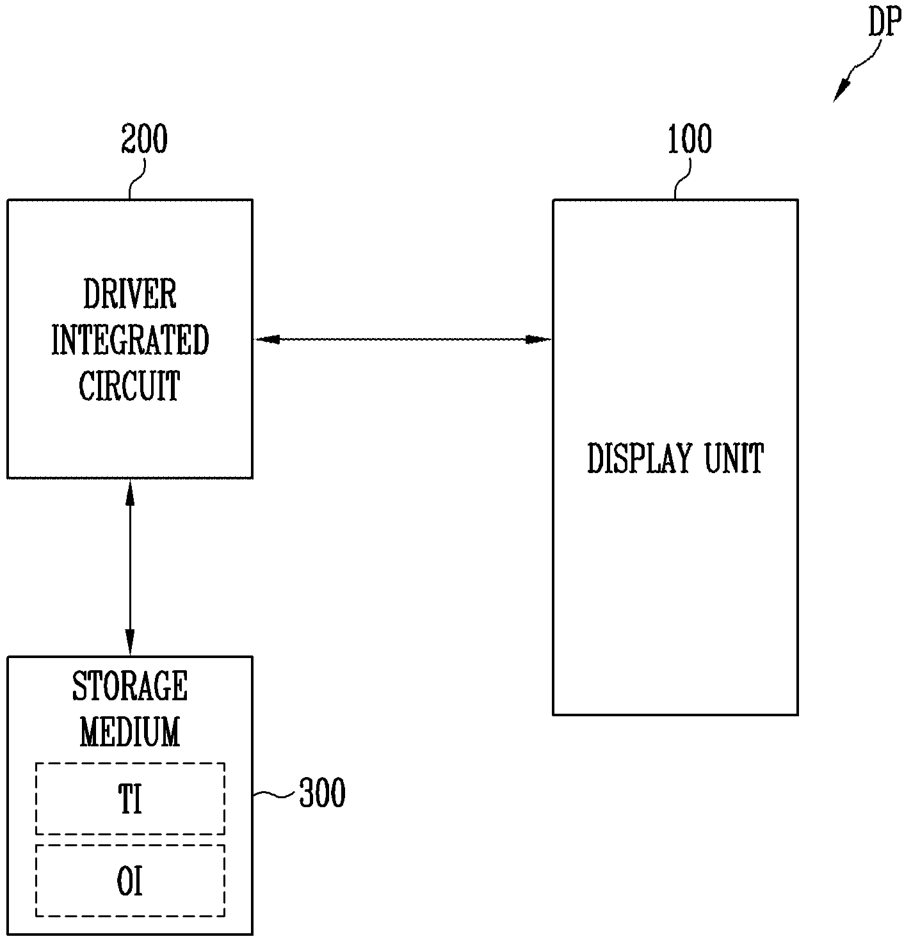
FIG. 4 is a block diagram illustrating an embodiment of the display panel of FIG. 2.

FIG. 4 is a block diagram illustrating an embodiment of the display panel of FIG. 2.

Referring to FIG. 4, the display panel DP may include the display unit 100, the driver integrated circuit 200, and the storage medium 300.

The display panel DP may include the display area DA and the non-display area NDA. Data lines, scan lines, voltage supply lines, and the pixels PX may be disposed in the display area DA.

Each of the pixels PX may be connected to the scan line, the data line, and the power supply line. Each of the pixels PX may include at least one or more thin film transistors, at least one or more capacitors, and a light emitting element. Each of the pixels PX may receive a data voltage through a data line during a period in which a scan signal is applied through the scan line. In addition, each of the pixels PX may emit light by supplying a driving current to the light emitting element according to the received data voltage.

The non-display area NDA may surround the display area DA at an edge of the display panel DP. At least a portion of the driver integrated circuit 200 may be disposed in the non-display area NDA. The driver integrated circuit 200 may be configured to drive the display unit 100 to display an image on the display unit 100. The driver integrated circuit 200 may include the plurality of integrated circuits. For example, the driver integrated circuit 200 may include a scan driver that applies scan signals to the scan lines and a data driver that applies data voltages to the data lines.

The storage medium 300 may store the temperature information TI and the other information OI. The temperature information TI may correspond to data for temperature increment values for each area of the display unit 100 due to the heat from the driver integrated circuit 200. Here, the data for the temperature increment values for each area may be a percentage value. The other information OI may include various pieces of information regarding heat generation of the display unit 100. For example, the other information OI may include heat generation information of the display unit 100 according to a driving frequency of the driver integrated circuit 200. For example, the other information OI may include heat generation information of the display unit 100 according to an amount of the data signal transmitted from the driver integrated circuit 200 to the display unit 100. For example, the other information OI may include a heat generation degree of the display unit 100 according to a luminance of the display unit 100. However, embodiments of the disclosure are not limited thereto, and the other information OI may further include various pieces of information regarding heat generation of the display unit 100.

The driver integrated circuit 200 may retrieve the temperature information TI and the other information OI from the storage medium 300. In addition, the driver integrated circuit 300 may generate the temperature map using the retrieved temperature information TI and other information OI. The driver integrated circuit 300 may predict the deterioration speed of the pixels PX of the display unit 100 through the generated temperature map. For example, the driver integrated circuit 300 may identify an area where a temperature is relatively higher than that of another area among areas of the display unit 100 through the generated temperature map. In addition, the driver integrated circuit 300 may predict that a deterioration speed is faster in the area where the temperature is relatively higher than that of another area among the areas of the display unit 100. Hereinafter, the temperature information TI are described in detail.

Figure 5:
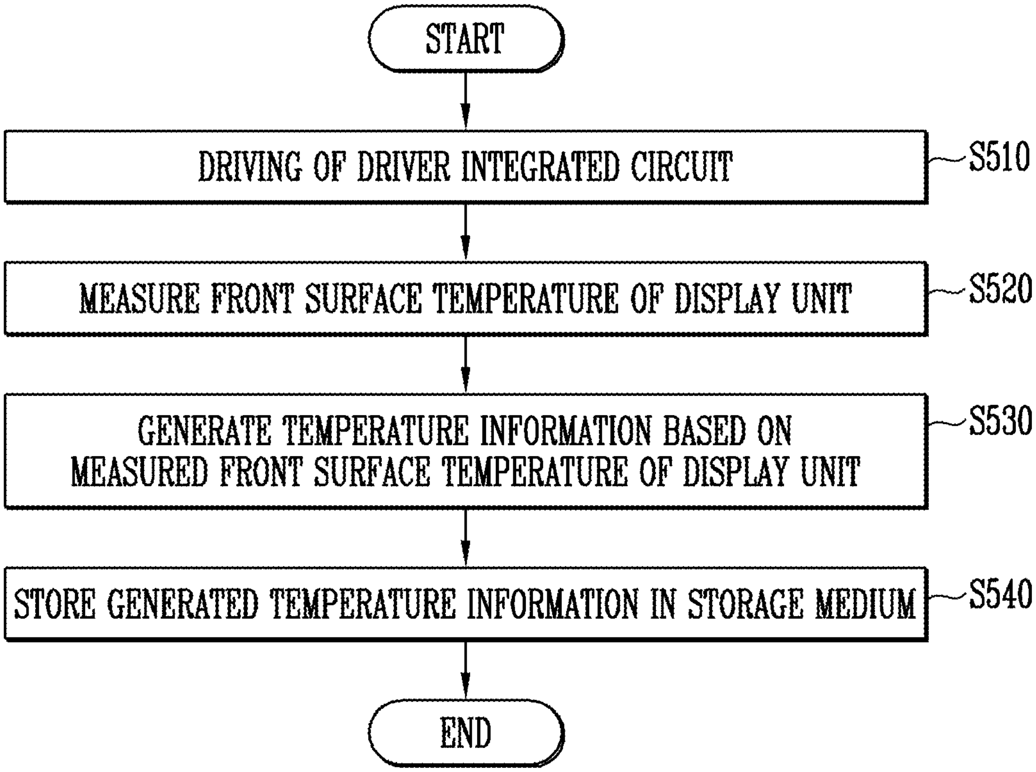
FIGS. 5 and 6 are flowcharts illustrating a method of generating temperature information of the display panel of FIG. 2 and storing the temperature information in a storage medium before product shipment.
Figure 6:
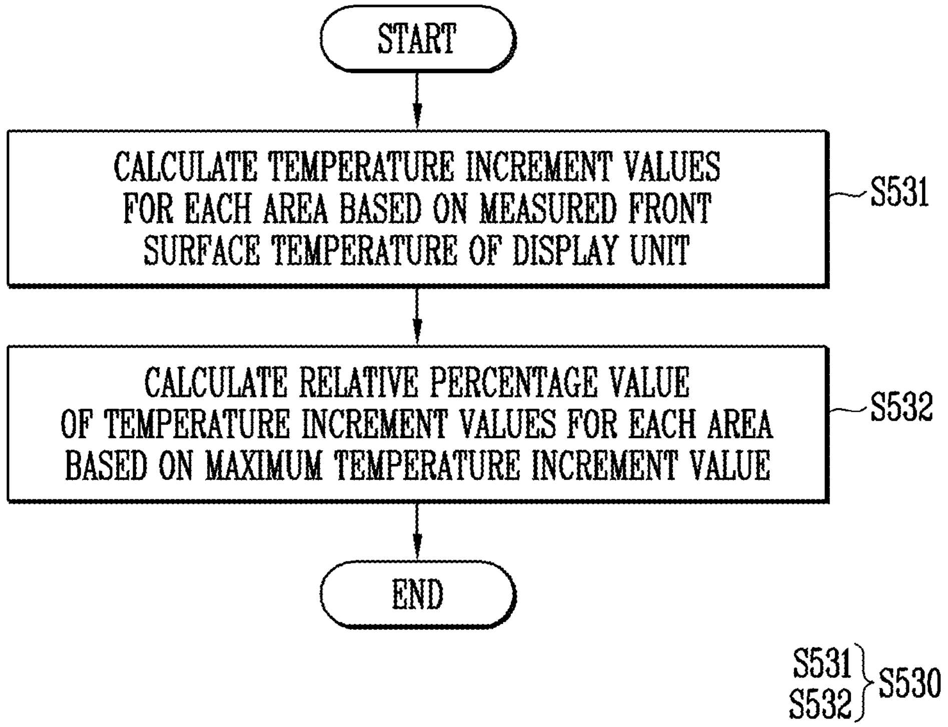

FIGS. 5 and 6 are flowcharts illustrating a method of generating temperature information of the display panel of FIG. 2 and storing the temperature information in a storage medium before shipment of a product.

Referring to FIGS. 5 and 6, before shipment of the product, the manufacturer may perform driving the driver integrated circuit 200 (S510). According to an embodiment, the manufacturer may drive only a partial integrated circuit among the plurality of integrated circuits included in the driver integrated circuit 200.

The manufacturer may drive the driver integrated circuit 200 and perform measuring a front surface temperature of the display unit 100 after a certain time has elapsed (S520).

The manufacturer may perform generating the temperature information TI based on the measured front surface temperature (S530).

In addition, the manufacturer may perform storing the generated temperature information TI in the storage medium 300 (S540). According to an embodiment, the manufacturer may additionally perform storing the other information OI in the storage medium 300.

Generating the temperature information TI based on the measured front surface temperature (S530) may include the following steps.

The manufacturer may perform calculating temperature increment values for each area based on the measured front surface temperature of the display unit 100 (S531). In addition, the manufacturer may perform calculating a relative percentage value of the temperature increment values for each area based on a maximum temperature increment value among maximum temperature increment values for each area. Generating the temperature information TI based on the measured front surface temperature (S530) is described later with reference to FIGS. 10 and 11.

Figure 7:
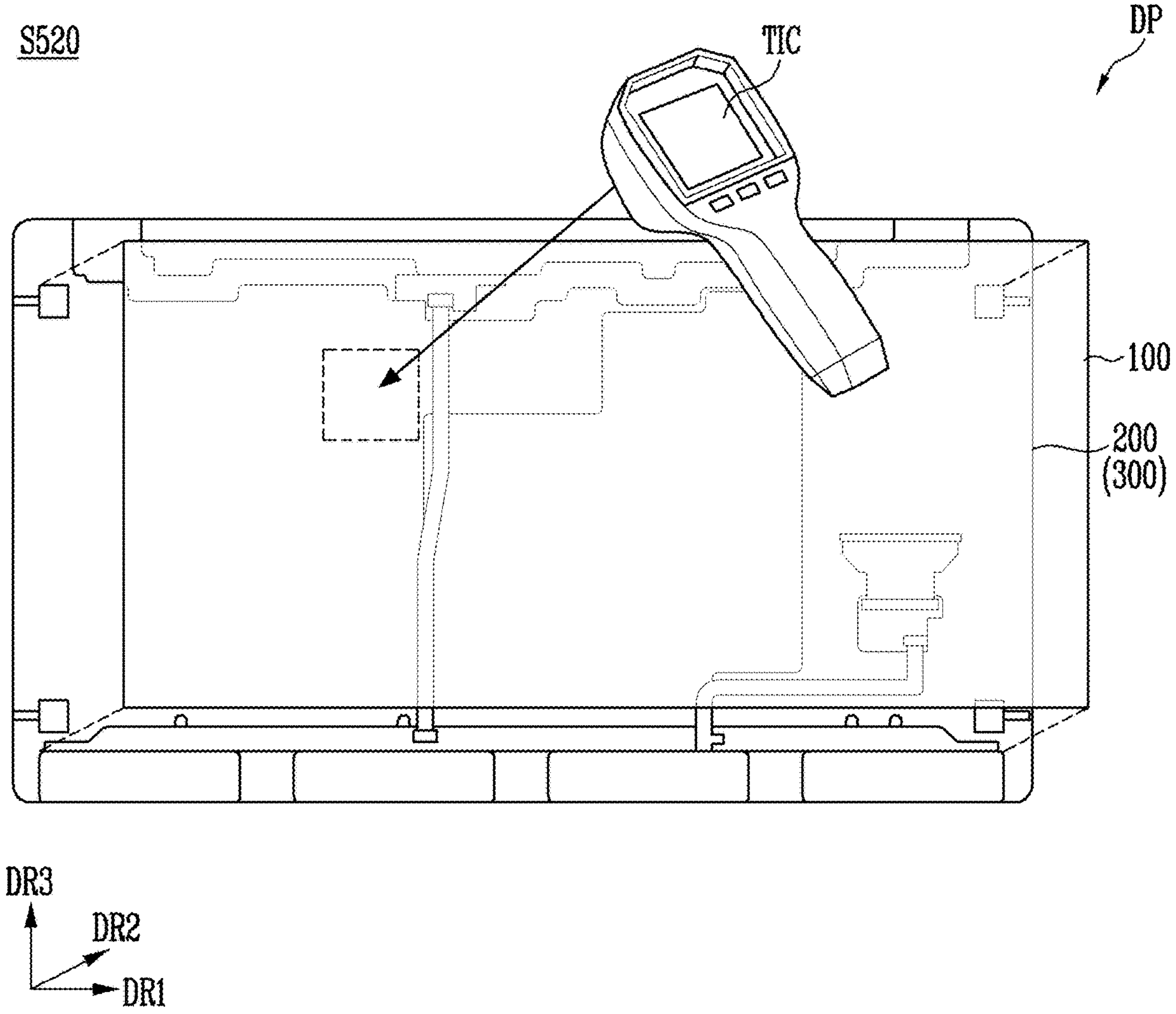
Figure 8:
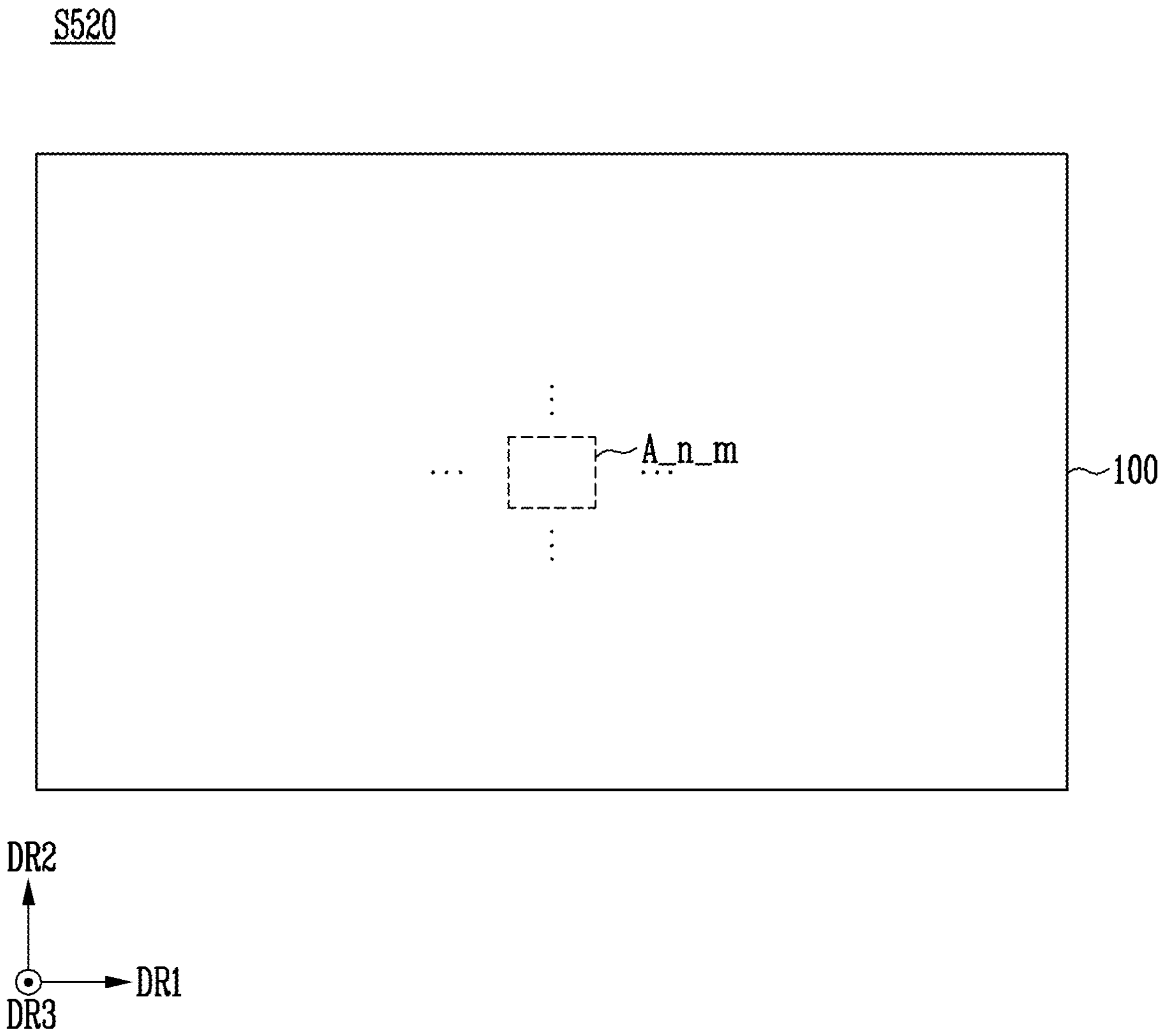

FIGS. 7 to 9 are diagrams illustrating step S520 of FIG. 5.

Referring to FIGS. 7 to 9, the display unit 100 may include a plurality of areas having the same area. The display unit 100 may include an area A_n_m positioned in an n-th (n is a positive integer greater than or equal to 1) row and an m-th (m is a positive integer greater than or equal to 1) column. According to an embodiment, the area of each of the plurality of areas may be determined to include the same number of pixels PX. For example, in an embodiment, each of the plurality of areas may include pixels PX disposed in 64 rows and 64 columns. However, embodiments of the disclosure are not necessarily limited thereto, and each of the plurality of areas may include pixels PX disposed in various numbers of rows and columns.

In step S520, the manufacturer may drive the driver integrated circuit 200 and measure a temperature of each of the plurality of areas of the display unit 100 using a thermal imaging camera TIC after a certain time has elapsed after driving the driver integrated circuit 200. When measuring the temperature of each of the plurality of areas of the display unit 100 using a thermal imaging camera TIC, the pixels PX disposed in the display unit 100 may display an image having the same gray scale. For example, a temperature value T_n_m of the area positioned in the n-th row and the m-th column may be measured using the thermal imaging camera TIC. However, an embodiment of the disclosure is not necessarily limited thereto, and various temperature measuring means may be used to measure the temperature of each of the plurality of areas of the display unit 100.

According to an embodiment, the manufacturer may drive only some of the integrated circuits of the driver integrated circuit 200 and measure the temperature of each of the plurality of areas of the display unit 100 after a certain time has elapsed after driving the driver integrated circuit 200.

FIG. 9 shows the temperature of each of the plurality of areas of the display unit 100. FIG. 9 is described under an assumption that the display unit 100 is divided into 160 areas. However, an embodiment of the disclosure is not limited thereto. For example, the display unit 100 may be divided into 160 or more areas. For example, the display unit 100 may be divided into 160 or less areas.

The temperature of each of the plurality of areas of the display unit 100 may be different. For example, a temperature value T_1_1 of an area positioned in a first row and a first column is 20° C. For example, a temperature value T_10_16 of an area positioned in a tenth row and sixteenth column is 25.1° C.

FIG. 10 is a diagram illustrating step S531 of FIG. 6.

Referring to FIG. 10, the manufacturer may perform calculating the temperature increment values for each area based on the measured front surface temperature of the display unit 100 (S531).

Here, the temperature increment values may be a value obtained by subtracting a temperature measurement value of the display unit 100 before driving the driver integrated circuit 200 from a temperature measurement value of the display unit 100 after driving the driver integrated circuit 200. In addition, the temperature measurement value may be obtained using a temperature measurement means (for example, a thermal imaging camera or the like) as described with reference to FIG. 7.

For example, a temperature increment value IV_n_m of an area positioned in the n-th row and m-th column may correspond to a change amount of a temperature value T_n_m of the area positioned in the n-th row and m-th column due to driving of the driver integrated circuit 200.

For example, a temperature measurement value of the front surface of the display unit 100 before driving the driver integrated circuit 200 may be 20° C. FIG. 10 shows temperature increment values for each area obtained by subtracting 20° C. from the temperature measurement value for each area of the display unit 100 after driving the driver integrated circuit 200 shown in FIG. 9. For example, a temperature increment value IV_1_1 of the area positioned in the first row and the first column after driving of the driver integrated circuit 200 is 0° C. For example, a temperature increment value IV_10_16 of the area positioned in the tenth row and the sixteenth column after driving of the driver integrated circuit 200 is 5.1° C. For example, a temperature increment value IV_5_8 of an area positioned in a fifth row and an eighth column after driving of the driver integrated circuit 200 is 23° C. In such a method, temperature increment values may also be calculated with respect to remaining areas of the display unit 100.

FIG. 11 is a diagram illustrating step S532 of FIG. 6.

Referring to FIG. 11, the manufacturer may perform calculating the relative percentage value of the temperature increments for each area based on the maximum temperature increment value among the temperature increment values for each area (S532). A specific process is as follows.

First, the manufacturer may obtain the maximum temperature increment value among the temperature increment values for each area.

In addition, a percentage value RP_n_m of the area positioned in the n-th row and the m-th column may be calculated by multiplying the temperature increment value IV_n_m of the area positioned in the n-th row and the m-th column by 100 and dividing by the maximum temperature increment value.

First, referring to FIG. 10, in an example, the maximum temperature increment value is 23° C., which is the temperature increment value IV_5_8 of the area positioned in the fifth row and the eighth column. In addition, a percentage value RP_5_8 of the area positioned in the fifth row and eighth column is 100%.

The temperature increment value IV_1_1 of the area positioned in the first row and the first column is 0° C. In addition, a percentage value RP_1_1 of the area positioned in the first row and the first column is 0%.

The temperature increment value IV_10_16 of the area positioned in the tenth row and the sixteenth column is 5.1° C. In addition, a percentage value RP_10_16 of the area positioned in the tenth row and the sixteenth column is 22%. In such a method, a percentage value may be calculated with respect to remaining areas.

The temperature information TI (refer to FIG. 4) stored in the storage medium 300 (refer to FIG. 4) may include the percentage values for the temperature increment values for each area and the maximum temperature increment value. In an example, the storage medium 300 may store 23° C. which is the maximum temperature increment value and a percentage value for the temperature increment values for each area shown in FIG. 11 of this case.

The storage medium 300 may additionally store the temperature information TI of a case where some of the integrated circuits of the driver integrated circuit 200 are driven. This is described later with reference to FIGS. 12 to 14.

Figure 13:
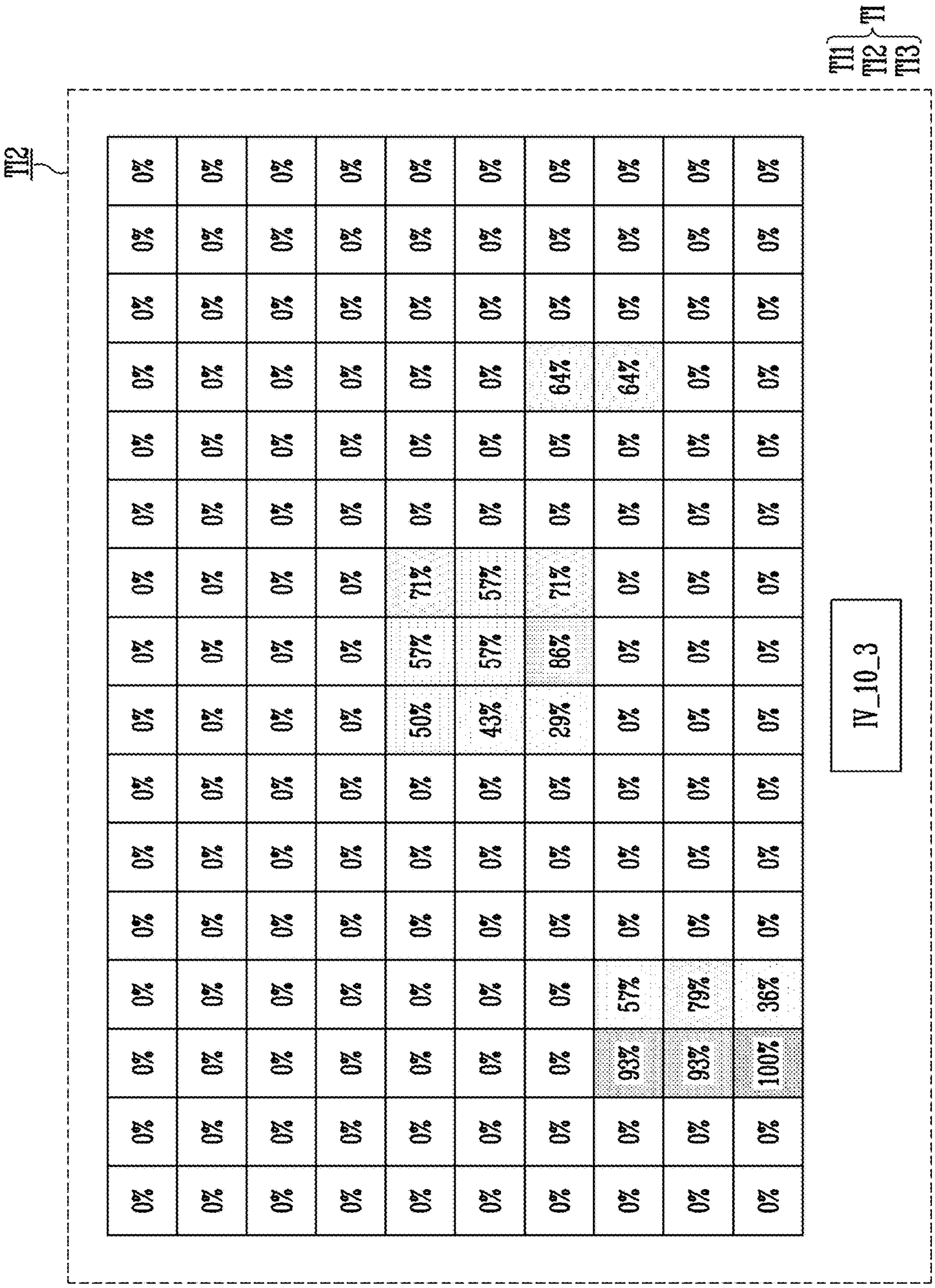

FIGS. 12 to 14 are diagrams illustrating the temperature information when driving some of the integrated circuits of the driver integrated circuit.

Referring to FIGS. 12 to 14, the driver integrated circuit 200 may include the plurality of integrated circuits. In addition, the temperature information TI may include first temperature information TI1, second temperature information TI2, and third temperature information TI3.

When one integrated circuit is driven in a state in which other integrated circuits are not driven, an influence of one integrated circuit on a temperature distribution for each area of the display unit 100 may be determined. In addition, first temperature information TI1 on the temperature distribution for each area of the display unit 100 of a case where only the one integrated circuit is driven is shown in FIG. 12. The first temperature information TI1 on the case where the one integrated circuit is driven may be stored in the storage medium 300. For example, the temperature increment value IV_5_8 of the area positioned in the fifth row and the eighth column and the percentage values for the temperature increment values for each area of the display unit 100 according thereto may be stored in the storage medium 300.

When another integrated circuit other than the one integrated circuit is driven in a state in which other integrated circuits are not driven, an influence of the other integrated circuit on the temperature distribution for each area of the display unit 100 may be determined. In addition, the second temperature information TI2 on the temperature distribution for each area of the display unit 100 of a case where only the another integrated circuit is driven is shown in FIG. 13. The second temperature information TI2 on the case where the another integrated circuit is driven may be stored in the storage medium 300. For example, a temperature increment value IV_10_3 of an area positioned in the tenth row and a third column and percentage values for the temperature increment values for each area of the display unit 100 according thereto may be stored in the storage medium 300.

When still another integrated circuit other than the one integrated circuit and the another integrated circuit is driven in a state in which other integrated circuits are not driven, an influence of the still other integrated circuit on the temperature distribution for each area of the display unit 100 may be determined. In addition, the third temperature information TI3 on the temperature distribution for each area of the display unit 100 of a case where only the still other integrated circuit is driven is shown in FIG. 14. The third temperature information TI3 on the case where the still other integrated circuit is driven may be stored in the storage medium 300. For example, a temperature increment value IV_10_2 of an area positioned in the tenth row and a second column and percentage values for the temperature increment values for each area of the display unit 100 according thereto may be stored in the storage medium 300.

The above-described process may be repeated with respect to other integrated circuits.

Figure 15:
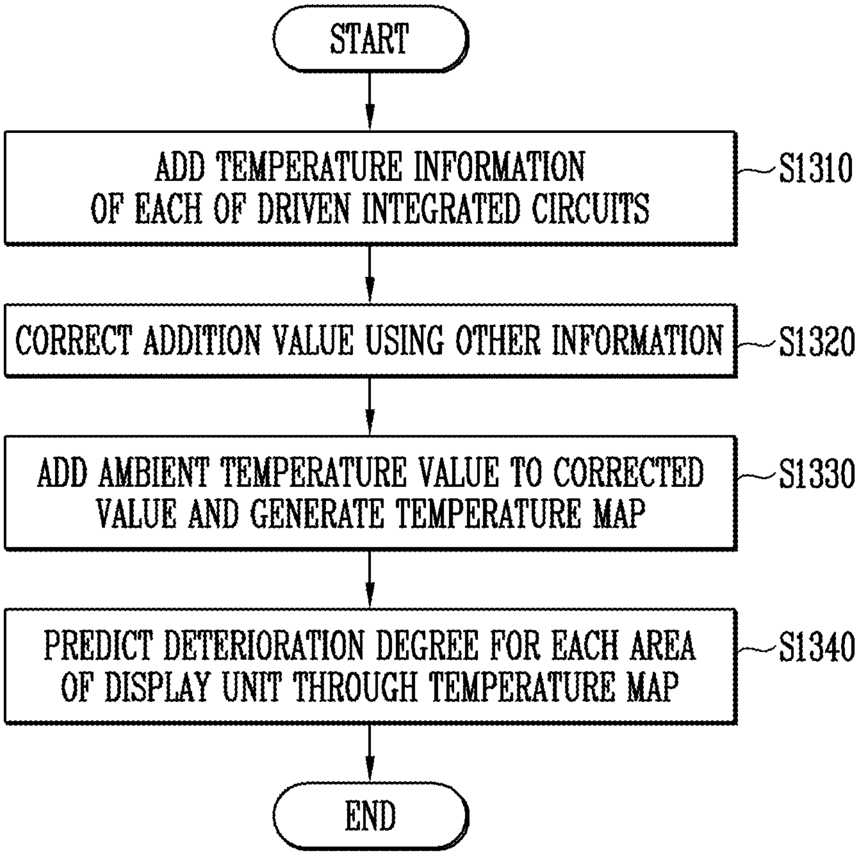
FIG. 15 is a flowchart illustrating a method of predicting a deterioration speed of each area of a display unit after product shipment using the temperature information stored in the storage medium before the product shipment.

FIG. 15 is a flowchart illustrating a method of predicting the deterioration speed for each area of the display unit after product shipment using the temperature information stored in the storage medium before product shipment.

When driving the driver integrated circuit 200 after product shipment, the driver integrated circuit may perform adding temperature information on driven integrated circuits among the plurality of integrated circuits (S1310). A process of adding the temperature information TI is described later with reference to FIG. 16.

The driver integrated circuit may perform correcting the temperature increment values for each area of the display unit, which are added using the temperature information, using the other information (S1320). For example, the driver integrated circuit 200 may correct the temperature increment values, which are added using the temperature information TI, using the heat generation information of the display unit 100 according to the driving frequency.

The driver integrated circuit may perform generating the temperature map by adding an ambient temperature value to the corrected temperature increment values for each area of the display unit (S1330).

The driver integrated circuit may perform predicting a deterioration degree (or a deterioration speed) for each area of the display unit based on the generated temperature map (S1340). For example, the driver integrated circuit 300 may identify the area where the temperature is relatively higher than that of another area among the areas of the display unit 100 through the generated temperature map. In addition, the driver integrated circuit 300 may predict that the deterioration speed is faster in the area where the temperature is relatively higher than that of another area among the areas of the display unit 100.

FIG. 16 is a diagram illustrating S1310 of FIG. 15.

Referring to FIGS. 15 and 16, in step S1310, the driver integrated circuit may add the temperature information of the integrated circuits which are driven among the plurality of integrated circuits.

For example, when driving the driver integrated circuit 200, only some of the plurality of integrated circuits may be driven. In addition, the first and second temperature information TI1 and TI2 (refer to FIGS. 12 and 13) may be the temperature information TI on some of the integrated circuits.

The first and second temperature information TI1 and TI2 for each of the integrated circuits may be stored in the storage medium 300. For example, the first temperature information TI1 may be temperature information when one integrated circuit is driven. The second temperature information TI2 may be temperature information when another integrated circuit is driven.

The first temperature information TI1 may include the temperature increment value IV_5_8 of the area positioned in the fifth row and the eighth column, which is the maximum temperature increment value, and the percentage values for the temperature increment values for each area of the display unit 100 according thereto. Hereinafter, the disclosure is described under an assumption that the maximum temperature increment value included in the first temperature information TI1 is 16° C.

The second temperature information TI2 may include the temperature increment value IV_10_3 of the area positioned in the tenth row and the third column, which is the maximum temperature increment value, and the percentage values for the temperature increment values for each area of the display unit 100 according thereto. Hereinafter, the disclosure is described under an assumption that the maximum temperature increment value included in the second temperature information TI2 is 14° C.

The driver integrated circuit 200 may retrieve the first and second temperature information TI1 and TI2 from the storage medium 300. In addition, the driver integrated circuit 200 may add the temperature increment values for each area of the display unit 100. A specific addition method is as follows.

For example, the temperature increment for the area positioned in the fifth row and the eighth column is to be calculated. In the first temperature information TI1, the temperature increment value of the area positioned in the fifth row and the eighth column is calculated as 16° C. based on the maximum temperature increment value and the percentage value for the temperature increment values for each area according thereto. In the second temperature information TI2, the temperature increment value of the area positioned in the fifth row and the eighth column is calculated as 7° C. based on the maximum temperature increment value and the percentage value for the temperature increment values for each area according thereto. In addition, the temperature increment value positioned in the fifth row and the eighth column may be 23° C. by adding the calculated 16° C. and 7° C.

For example, a temperature increment for an area positioned in a second row and the eighth column is to be calculated. In the first temperature information TI1, the temperature increment value of the area positioned in the second row and the eighth column is calculated as 4° C. based on the maximum temperature increment value and the percentage value for the temperature increment values for each area according thereto. In the second temperature information TI2, the temperature increment value of the area positioned in the second row and the eighth column is calculated as 0° C. based on the maximum temperature increment value and the percentage value for temperature increment values for each area according thereto. In addition, the temperature increment value positioned in the fifth row and the eighth column may be 4° C. by adding the calculated 4° C. and 0° C.

In such a method, temperature increment values when only some of the plurality of integrated circuits are driven may be calculated with respect to remaining areas.

Figure 17:
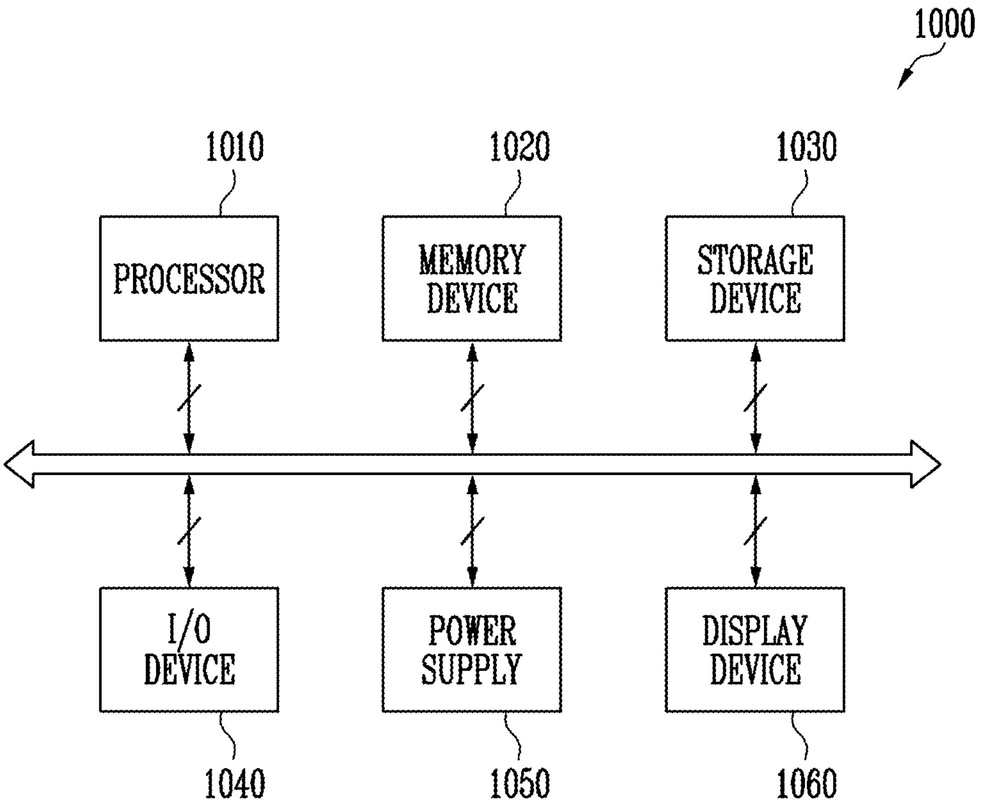
FIG. 17 is a block diagram illustrating an electronic device according to embodiments of the disclosure.
Figure 18:
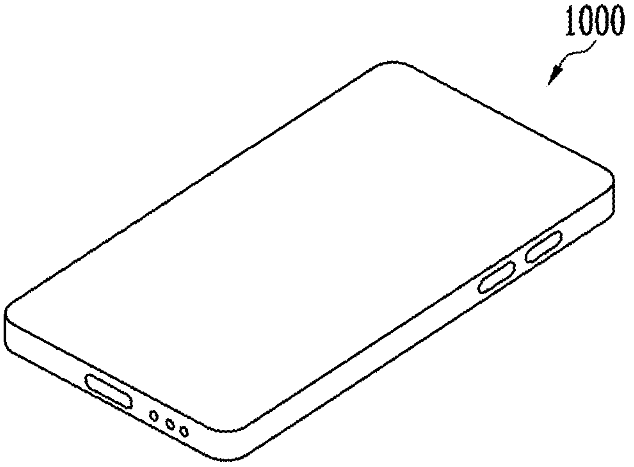
FIG. 18 is a diagram illustrating an example in which the electronic device of FIG. 17 is implemented as a smartphone.

FIG. 17 is a block diagram illustrating an electronic device according to embodiments of the disclosure, and FIG. 18 is a diagram illustrating an example in which the electronic device of FIG. 17 is implemented as a smartphone.

Referring to FIGS. 17 and 18, the electronic device 1000 may include a processor 1010, a memory device 1020, a storage device 1030, an input/output device (I/O device) 1040, a power supply 1050, and a display device 1060. The display device 1060 may be the display device DD of FIG. 1. In addition, the electronic device 1000 may further include several ports capable of communicating with a video card, a sound card, a memory card, a USB device, or the like, or communicating with other systems. In an embodiment, as shown in FIG. 18, the electronic device 1000 may be implemented as a smart phone. However, this is an exemplary, and the electronic device 1000 is not limited thereto. For example, the electronic device 1000 may be implemented as a mobile phone, a video phone, a smart pad, a smart watch, a tablet PC, a vehicle navigation device, a computer monitor, a notebook computer, a head mounted display device, or the like.

The processor 1010 may perform specific calculations or tasks. According to an embodiment, the processor 1010 may be a microprocessor, a central processing unit, an application processor, or the like. The processor 1010 may be connected to other components through an address bus, a control bus, a data bus, or the like. According to an embodiment, the processor 1010 may also be connected to an expansion bus such as a peripheral component interconnect (PCI) bus.

The memory device 1020 may store data necessary for an operation of the electronic device 1000. For example, the memory device 1020 may include a non-volatile memory device such as an erasable programmable read-only memory (EPROM) device, an electrically erasable programmable read-only memory (EEPROM) device, a flash memory device, a phase change random access memory (PRAM) device, a resistance random access memory (RRAM) device, a nano floating gate memory (NFGM) device, a polymer random access memory (PoRAM) device, a magnetic random access memory (MRAM), and a ferroelectric random access memory (FRAM) device, a volatile memory device such as a dynamic random access memory (DRAM) device, a static random access memory (SRAM) device, and a mobile DRAM device, and/or the like.

The storage device 1030 may include a solid state drive (SSD), a hard disk drive (HDD), a CD-ROM, and the like.

The input/output device 1040 may include an input means such as a keyboard, a keypad, a touch pad, a touch screen, and a mouse, and an output means such as a speaker and a printer. According to an embodiment, the display device 1060 may be included in the input/output device 1040.

The power supply 1050 may supply power necessary for an operation of the electronic device 1000. For example, the power supply 1050 may be a power management integrated circuit (PMIC).

The display device 1060 may display an image corresponding to visual information of the electronic device 1000. The display device 1060 may be an organic light emitting display device or a quantum dot light emitting display device, but is not limited thereto. The display device 1060 may be connected to other components through the buses or other communication links.

Although specific embodiments and application examples are described herein, other embodiments and variations may be derived from the above description. Therefore, the spirit of the disclosure is not limited to these embodiments, but extends to the scope of the claims set forth below, various obvious modifications, and equivalents.

What is claimed is:

1. A display device comprising:
- a display unit including a plurality of areas;
- a driver integrated circuit including a plurality of integrated circuits driving the display unit; and
- a storage medium configured to store temperature information of the display unit,
- wherein each of the temperature information includes data for temperature increment values for each area of the display unit when the driver integrated circuit is driven,
- wherein the plurality of integrated circuits include a first integrated circuit and a second integrated circuit,
- wherein the temperature information includes first temperature information and second temperature information,
- wherein the first temperature information is generated in a state in which the second integrated circuit is not driven and the first integrated circuit is driven, and
- wherein the second temperature information is generated in a state in which the first integrated circuit is not driven and the second integrated circuit is driven.

2. The display device according to claim 1, wherein the data for the temperature increment values for each area is percentage values.

3. The display device according to claim 2, wherein each of the percentage value is a value obtained by dividing a temperature increment value of one of the plurality of areas by a maximum temperature increment value of the plurality of areas.

4. The display device according to claim 3, wherein each of the temperature information includes the maximum temperature increment value.

5. The display device according to claim 1, wherein the storage medium further stores other information which includes heat generation information of the display unit according to a driving frequency of the driver integrated circuit and heat generation information of the display unit according to an amount of a data signal transmitted to the display unit from the driver integrated circuit.

6. The display device according to claim 5, wherein the driver integrated circuit retrieves the temperature information and the other information from the storage medium, generates a temperature map using the temperature information and the other information, and predicts a deterioration degree for each area of the display unit based on the temperature map.

7. The display device according to claim 1, wherein each of the plurality of areas has the same area.

8. The display device according to claim 1, wherein each of the temperature increment values is a value obtained by subtracting a temperature measurement value before driving the driver integrated circuit from a temperature measurement value after driving the driver integrated circuit.

9. The display device according to claim 8, wherein the temperature measurement value is a value measured using a thermal imaging camera.

10. A method of predicting deterioration of a display panel including a display unit which includes a plurality of areas and a driver integrated circuit which includes a plurality of integrated circuits driving the display unit, the method comprising:

driving the driver integrated circuit, measuring a front temperature of the display unit, generating temperature information based on the measured front temperature of the display unit, and storing the generated temperature information in a storage medium before shipment of a product, wherein generating the temperature information before shipment of the product comprises:

calculating temperature increment values for each area of the display unit when the driver integrated circuit is driven, and converting the temperature increment values for each area into a percentage value, wherein the plurality of integrated circuits include a first integrated circuit and a second integrated circuit, wherein the temperature information includes first temperature information and second temperature information, wherein the first temperature information is generated in a state in which the second integrated circuit is not driven and the first integrated circuit is driven, and wherein the second temperature information is generated in a state in which the first integrated circuit is not driven and the second integrated circuit is driven.

11. The method according to claim 10, further comprising:

storing other information in the storage medium before shipment of the product, wherein the other information includes heat generation information of the display unit according to a driving frequency of the driver integrated circuit and heat generation information of the display unit according to an amount of a data signal transmitted to the display unit from the driver integrated circuit.

12. The method according to claim 10, wherein each of the plurality of areas has the same area.

13. The method according to claim 10, wherein each of the temperature increment values is a value obtained by subtracting a temperature measurement value before driving the driver integrated circuit from a temperature measurement value after driving the driver integrated circuit.

14. The method according to claim 13, wherein the temperature measurement value is a value measured using a thermal imaging camera.

15. The method according to claim 10, wherein the percentage value is a value obtained by dividing a temperature increment value of one of the plurality of areas by a maximum temperature increment value of the plurality of areas.

16. The method according to claim 15, wherein the temperature information includes the maximum temperature increment value.

17. A method of predicting deterioration of an electronic device including a display panel, the display panel including a display unit which includes a plurality of areas and a driver integrated circuit which includes a plurality of integrated circuits driving the display unit, the method comprising:

driving the driver integrated circuit, measuring a front temperature of the display unit, generating temperature information based on the measured front temperature of the display unit, and storing the generated temperature information in a storage medium before shipment of a product; and generating a temperature map based on the temperature information after shipment of the product, wherein the generating the temperature information before shipment of the product comprises:

calculating temperature increment values for each area of the display unit when the driver integrated circuit is driven, and converting the temperature increment values for each area into a percentage value, wherein the plurality of integrated circuits include a first integrated circuit and a second integrated circuit, wherein the temperature information includes first temperature information and second temperature information, wherein the first temperature information is generated in a state in which the second integrated circuit is not driven and the first integrated circuit is driven, and wherein the second temperature information is generated in a state in which the first integrated circuit is not driven and the second integrated circuit is driven.

18. The method according to claim 17, further comprising:

storing other information in the storage medium before shipment of the product; and compensating the temperature map based on the other information and predicting deterioration of the electronic device through the compensated temperature map after shipment of the product, wherein the other information includes heat generation information of the display unit according to a driving frequency of the driver integrated circuit and heat generation information of the display unit according to an amount of a data signal transmitted to the display unit from the driver integrated circuit.

* * * * *